US008669609B2

(12) United States Patent
Kang

(10) Patent No.: US 8,669,609 B2
(45) Date of Patent: Mar. 11, 2014

(54) NON-VOLATILE MEMORY (NVM) CELL FOR ENDURANCE AND METHOD OF MAKING

(75) Inventor: Sung-Taeg Kang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 430 days.

(21) Appl. No.: 13/036,516

(22) Filed: Feb. 28, 2011

(65) Prior Publication Data
US 2012/0217573 A1 Aug. 30, 2012

(51) Int. Cl.
*H01L 21/336* (2006.01)
*H01L 29/792* (2006.01)

(52) U.S. Cl.
USPC ....... 257/326; 257/E21.18; 438/265; 438/591

(58) Field of Classification Search
USPC .......................................... 257/326; 438/265
See application file for complete search history.

(56) References Cited

U.S. PATENT DOCUMENTS

| | | | |
|---|---|---|---|
| 7,821,055 B2 * | 10/2010 | Loiko et al. | 257/316 |
| 7,985,649 B1 * | 7/2011 | Winstead et al. | 438/260 |
| 8,163,615 B1 * | 4/2012 | White et al. | 438/257 |
| 8,372,699 B2 * | 2/2013 | Kang et al. | 438/144 |
| 8,536,006 B2 * | 9/2013 | Shroff et al. | 438/257 |
| 2010/0230744 A1 | 9/2010 | Phua et al. | |
| 2012/0052669 A1 * | 3/2012 | Shroff | 438/591 |
| 2012/0052670 A1 * | 3/2012 | Shroff | 438/591 |

OTHER PUBLICATIONS

U.S. Appl. No. 12/683,972, Brian A. Winstead, et al., Method of Making a Semiconductor Structure Useful in Making a Split Gate Non-Volatile Memory Cell, filed Jan. 7, 2010.

\* cited by examiner

*Primary Examiner* — Matthew Landau
*Assistant Examiner* — Igwe U Anya
(74) *Attorney, Agent, or Firm* — James L. Clingan, Jr.; Joanna G. Chiu

(57) ABSTRACT

A first dielectric is formed over a semiconductor layer, a first gate layer over the first dielectric, a second dielectric over the first gate layer, and a third dielectric over the second dielectric. An etch is performed to form a first sidewall of the first gate layer. A second etch is performed to remove portions of the first dielectric between the semiconductor layer and the first gate layer to expose a bottom corner of the first gate layer and to remove portions of the second dielectric between the first gate layer and the third dielectric layer to expose a top corner of the first gate layer. An oxide is grown on the first sidewall and around the top and bottom corners to round the corners. The oxide is then removed. A charge storage layer and second gate layer is formed over the third dielectric layer and overlapping the first sidewall.

20 Claims, 6 Drawing Sheets

NON-VOLATILE MEMORY (NVM) CELL FOR ENDURANCE AND METHOD OF MAKING

BACKGROUND

1. Field

This disclosure relates generally to non-volatile memories (NVMs), and more specifically, to making NVM cells with improved endurance and program disturb.

2. Related Art

Endurance of an NVM is typically measured by the number of program and erase cycles that can be performed while maintaining charge storage for a predefined time period. Endurance is a significant limitation in the utility of an NVM and work to improve endurance is currently significant and appears likely to continue so indefinitely. Degradation of a dielectric film through which charge is transferred is a major cause of limiting endurance and program disturb. This degradation is mostly due to trap-up in which charge, as more and more program/erase cycles are performed, is trapped in the dielectric and increased leakage with increased usage.

Accordingly, it is desirable to provide a technique that improves endurance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an NVM cell is made by performing at etch back to form an undercut under the gate and between the gate and an overlying dielectric that has a different etch characteristic than the material being undercut. Particularly for this purpose are oxide for the undercut materials, nitride as an anti-reflective coating (ARC) for the overlying material, polysilicon for the gate, and silicon for the substrate that underlies the gate. An oxidation step is performed to form an oxide layer on the polysilicon gate and silicon substrate. This oxidation has the affect of rounding the corners so that the corners are rounded at the polysilicon gate at the top portion just under the overlying dielectric and the lower portion just over the substrate. This rounding reduces the field at the corners during programming and erase. With regard to the upper corner of the select gate in particular, the strength of the electric field is reduced so tunneling electrons that may be able to pass between the control gate and the select gate are reduced. Reducing the tunneling electrons that may traverse this path is particularly significant because the tunneling electrons are the ones most likely to cause leakage inducing damage. Also introducing additional oxide in this upper corner helps to reduce the tunneling current density because the ARC that is present there has relatively high leakage. This is better understood by reference to the following description and the drawings.

Figure 1:
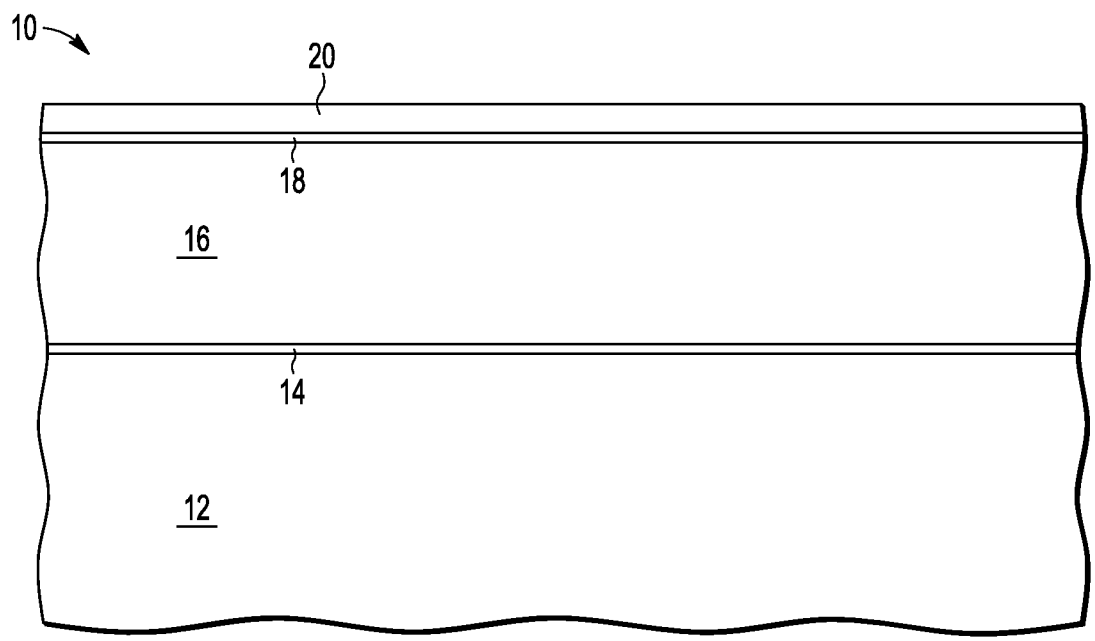
FIG. 1 is a cross section of a semiconductor device at a stage in processing according to an embodiment.

Shown in FIG. 1 is a semiconductor device 10 including a substrate 12, a gate dielectric 14 on substrate 12, a gate layer 16 on gate dielectric 14, a dielectric layer 18 on gate layer 16, and a dielectric layer 20 on dielectric layer 18. Semiconductor device 10 is a portion of a greater circuit formed on substrate 12. Gate dielectric 14 may be a grown oxide on substrate 12. Substrate 12 may be monocrystalline silicon. At this stage in processing, gate dielectrics may be grown over many portions of the greater circuit as well. This is preferably performed early in the process of the greater circuit and may be performed at a relatively high temperature such as in the order of 1000 degrees Celsius. Gate layer 16 may be polysilicon which is common for forming gates. Prior to forming gate layer 16, an implant may be performed, especially over the greater circuit, as a threshold adjust implant. Dielectric layer 18 may also be a grown oxide but it is beneficial for it to be a lower temperature than the grown oxide that may be used for gate dielectric 14. For growing dielectric layer 18 as an oxide, ozone may be used and the temperature can be around 500 degrees Celsius. A lower temperature is preferably due to thermal budget considerations such are related to the already performed threshold adjust implant. This type of oxide made using ozone is not quite the quality of growing oxide on substrate 12 at in the order of 1000 degrees so dielectric 18 may be thicker than gate dielectric 14. Dielectric layer 20 may be formed by a deposition of nitride on dielectric layer 18. The preferred nitride is silicon-rich nitride because of its better reflective characteristics than stoichiometric nitride. Also nitride has a different etch characteristic than dielectric layer 18 and gate dielectric 14 so that dielectric layer 18 and gate dielectric 14 may be etched selective to dielectric layer 20. The materials chosen are believed to have particular benefit but it may be effective to choose other materials and processes instead.

Figure 2:
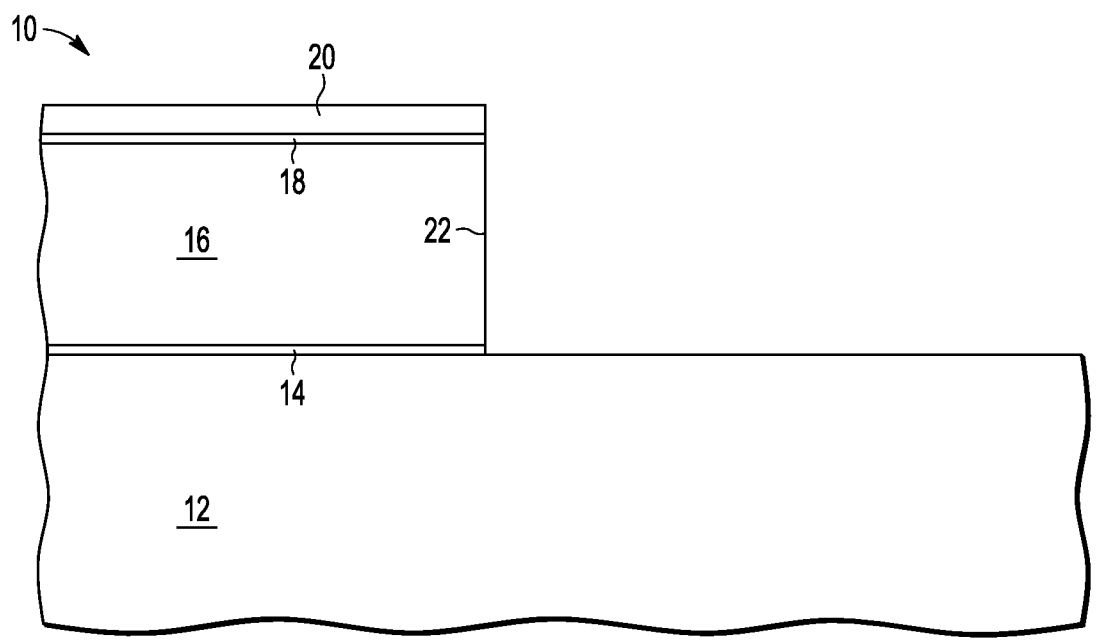
FIG. 2 is a cross section of the semiconductor device of FIG. 1 at a subsequent stage in processing.

Shown in FIG. 2 is semiconductor device 10 after performing a patterned etch, anisotropically, through dielectric layer 20, dielectric layer 18, gate layer 16, and gate dielectric 14 to expose a side 22 of gate layer 16 with exposed edges of dielectric layer 20, dielectric layer 18, and gate dielectric 14 aligned to side 22. It is a known approach to form a select gate of an NVM cell by etching to form one side before etching to form an opposite side of the select gate.

Figure 3:
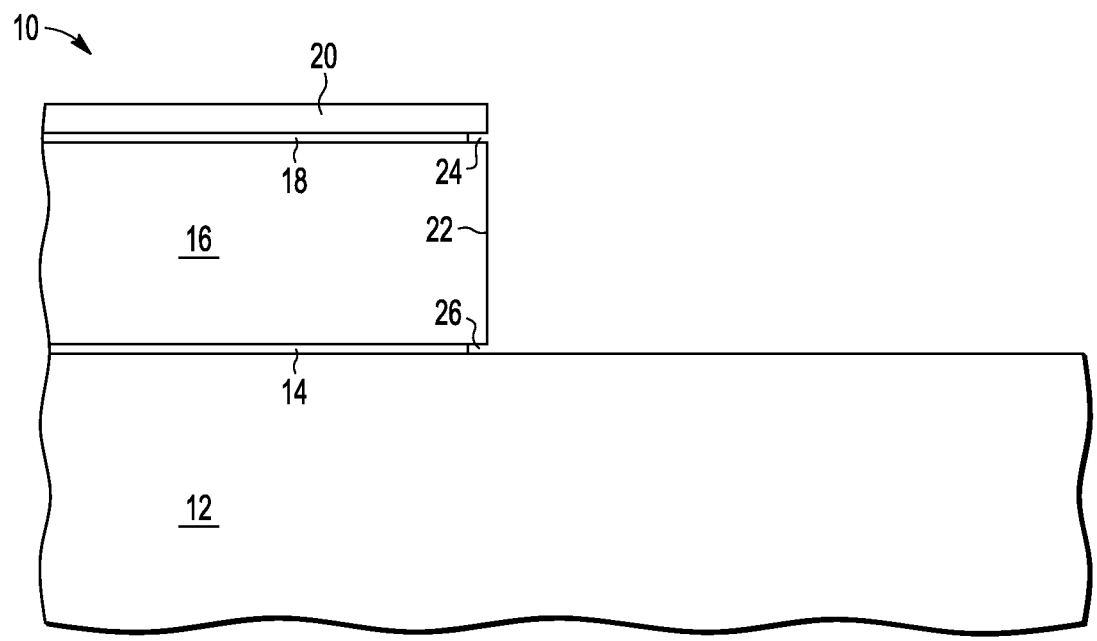
FIG. 3 is a cross section of the semiconductor device of FIG. 2 at a subsequent stage in processing.

Shown in FIG. 3 is semiconductor device 10 after performing an isotropic oxide etch that is selective to dielectric layer 20 and gate layer 16. One etchant that is effective for this purpose is a wet etch such as dilute hydrofluoric acid (HF). The result is an undercut 24 of dielectric layer 18 and an undercut 26 of gate dielectric 14 from side 22. Undercuts 24 and 26 may extend about 2 to 5 nanometers from side 22. There is little effect on substrate 12, gate layer 16, and dielectric layer 20 in the etch that forms undercuts 24 and 26.

Figure 4:
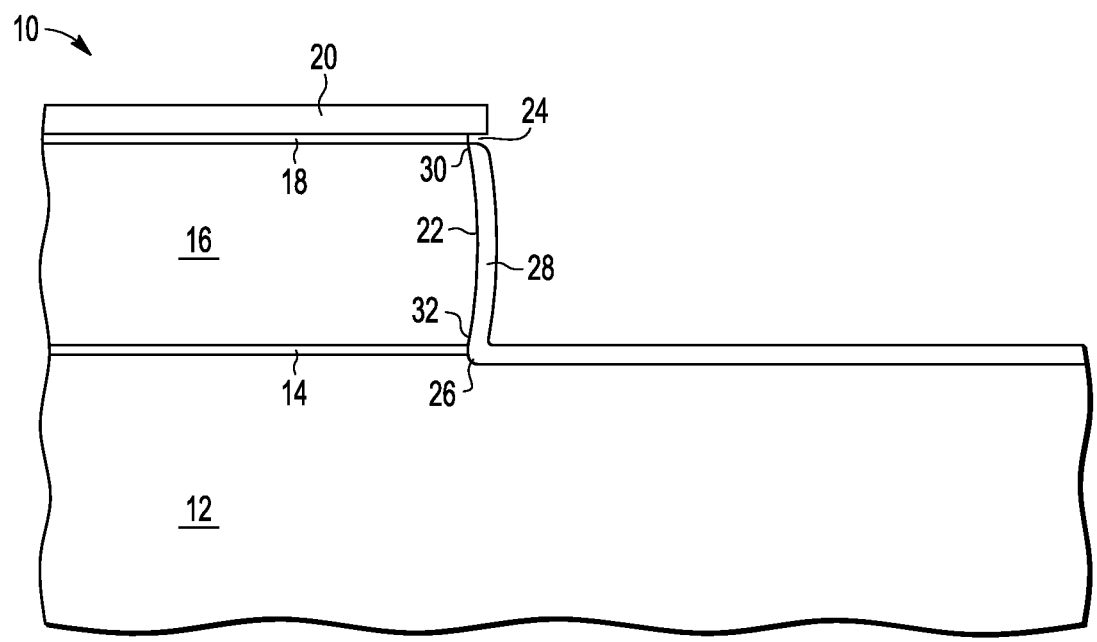
FIG. 4 is a cross section of the semiconductor device of FIG. 3 at a subsequent stage in processing.

Shown in FIG. 4 is semiconductor device 10 after growing an oxide layer 28 on the exposed silicon of side 22 of gate layer 16, top surface of substrate 12, exposed gate layer 16 and substrate 12 of undercut 26, and exposed gate layer 16 of undercut 24. This has the effect of growing oxide on corners at each of side 22 with result that rounding of gate layer 16 at those corners as shown as rounded corner 30 at the top portion of side 22 and rounded corner 32 at the lower portion of side 22.

Figure 5:
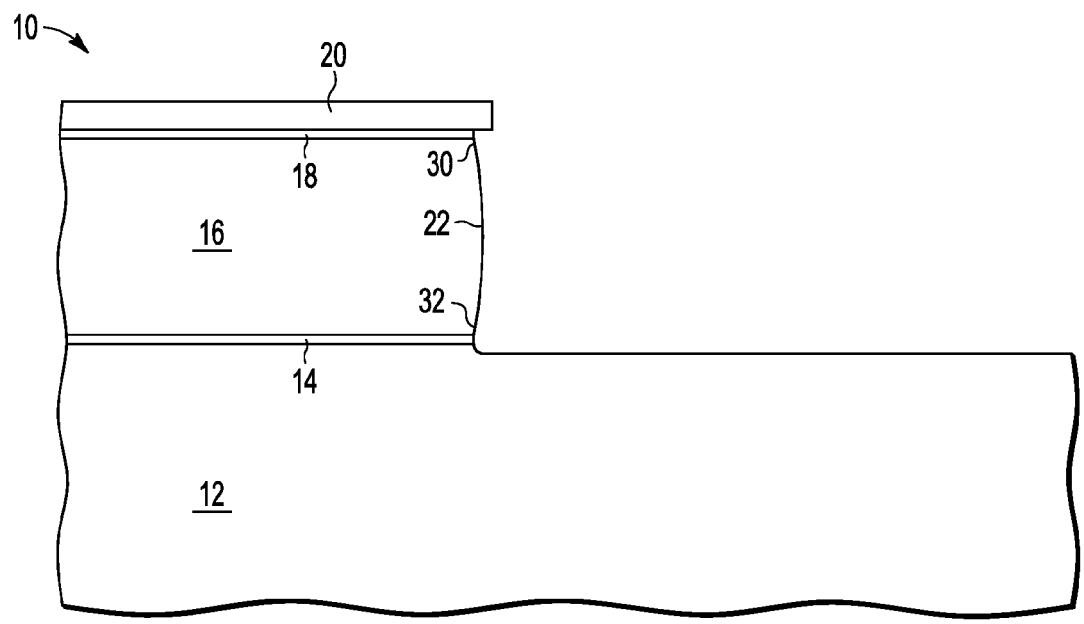
FIG. 5 is a cross section of the semiconductor device of FIG. 4 at a subsequent stage in processing.

Shown in FIG. 5 is semiconductor device 10 after removing oxide layer 28 using an isotropic etchant which again may be a wet etch of dilute HF. This shows that side 22 has rounded corners 30 and 32 remaining after the etch.

Figure 6:
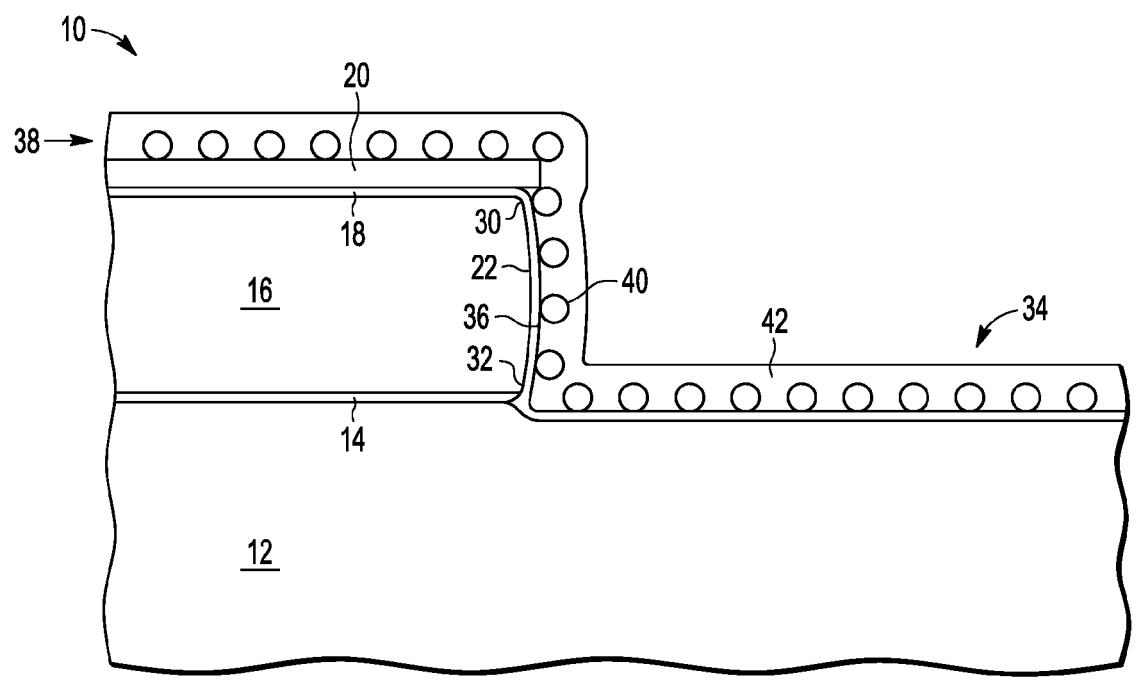
FIG. 6 is a cross section of the semiconductor device of FIG. 5 at a subsequent stage in processing.

Shown in FIG. 6 is semiconductor device 10 after forming a charge storage layer 34 comprising a dielectric layer 36 formed on exposed silicon of gate layer 16 including rounded corners 30 and 32 and exposed substrate 12. Growing dielectric layer 36 as an oxide layer causes additional rounding of rounded corners 30 and 32. Charge storage layer 34 further includes a layer of nanocrystals 38 including nanocrystal 40 on dielectric layer 36 and dielectric layer 20 and a dielectric layer 42 that is over and surrounds the nanocrystals. Dielectric layer 42 may be a layer of deposited oxide.

Figure 7:
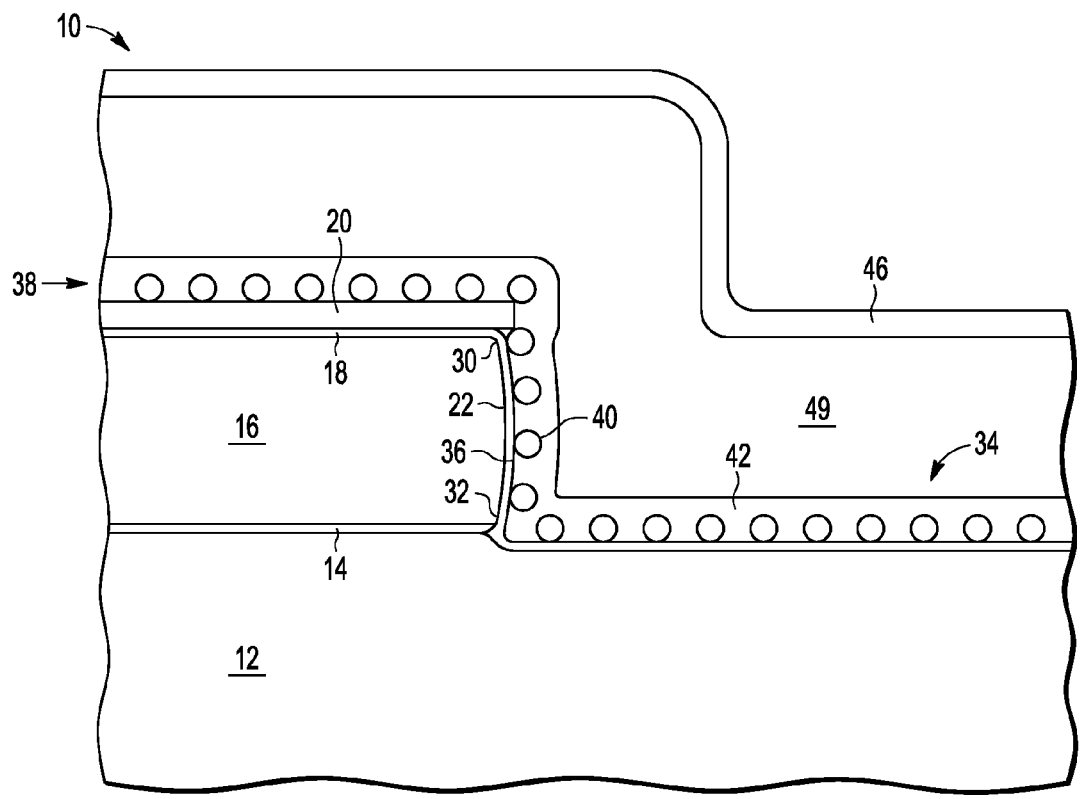
FIG. 7 is a cross section of the semiconductor device of FIG. 6 at a subsequent stage in processing.

Shown in FIG. 7 is semiconductor device 10 after depositing a gate layer 44 over charge storage layer 34 and a dielectric layer 46 over gate layer 44. Dielectric layer 46 is for use as an ARC. Gate layer 44 may be a little thinner than gate layer 16. Gate layer 44 is for forming a control gate.

Figure 8:
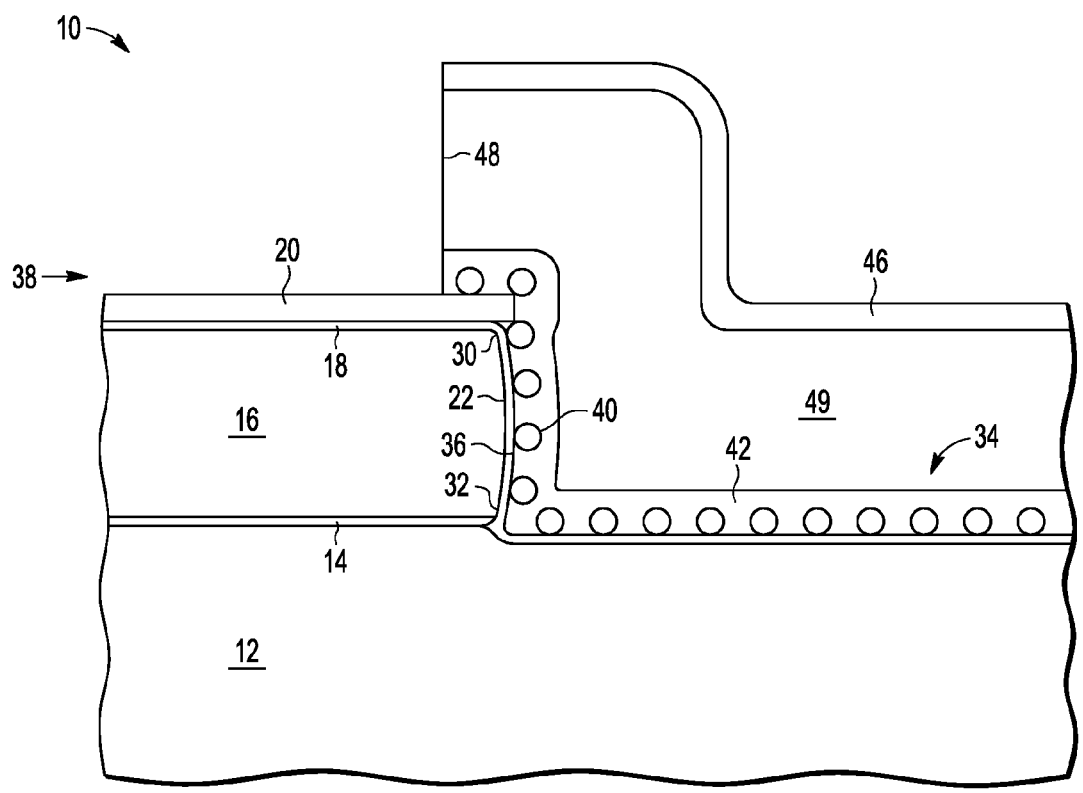
FIG. 8 is a cross section of the semiconductor device of FIG. 7 at a subsequent stage in processing.

Shown in FIG. 8 is semiconductor device 10 after pattern etching gate layer 44, dielectric layer, and charge storage layer 34 to expose a side 48 of gate layer 44 over gate layer 16. This etch is an anisotropic etch that stops on dielectric layer 20.

Figure 9:
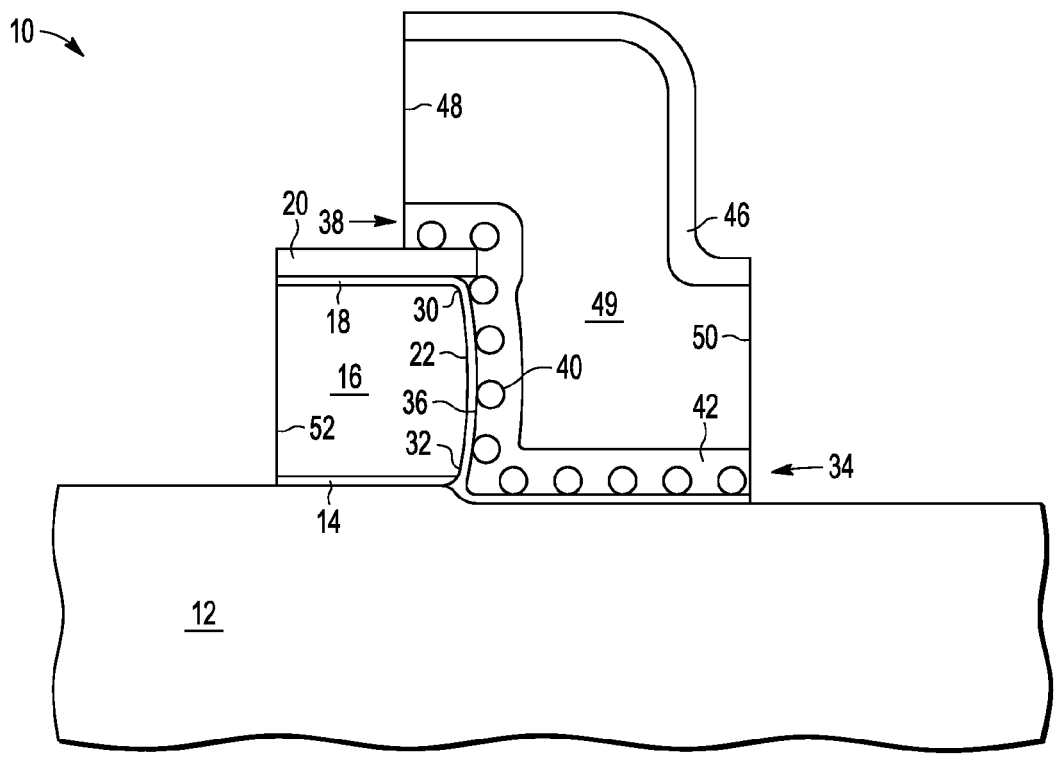
FIG. 9 is a cross section of the semiconductor device of FIG. 8 at a subsequent stage in processing.

Shown in FIG. 9 is semiconductor device 10 after pattern etching dielectric layer 20, dielectric layer 18, gate layer 16, and gate dielectric 14 to expose a side 52 of gate layer 16. Side 52 is opposite side 22 and spaced away from side 48 so that side 48 is still over gate layer 16.

Figure 10:
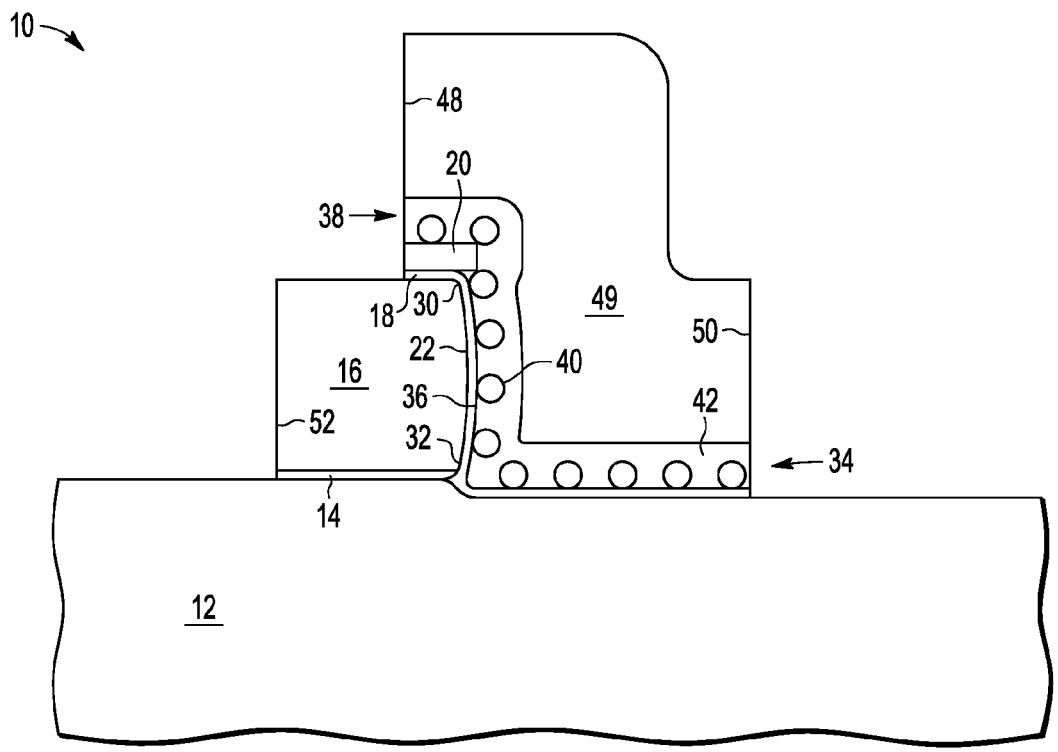
FIG. 10 is a cross section of the semiconductor device of FIG. 9 at a subsequent stage in processing.

Shown in FIG. 10 is semiconductor device 10 after pattern etching gate layer 44 and charge storage layer 34 to leave a side 50 of gate layer 44 that is exposed. Dielectric layer 20 and dielectric layer 18 are removed between sides 52 and 48.

Figure 11:
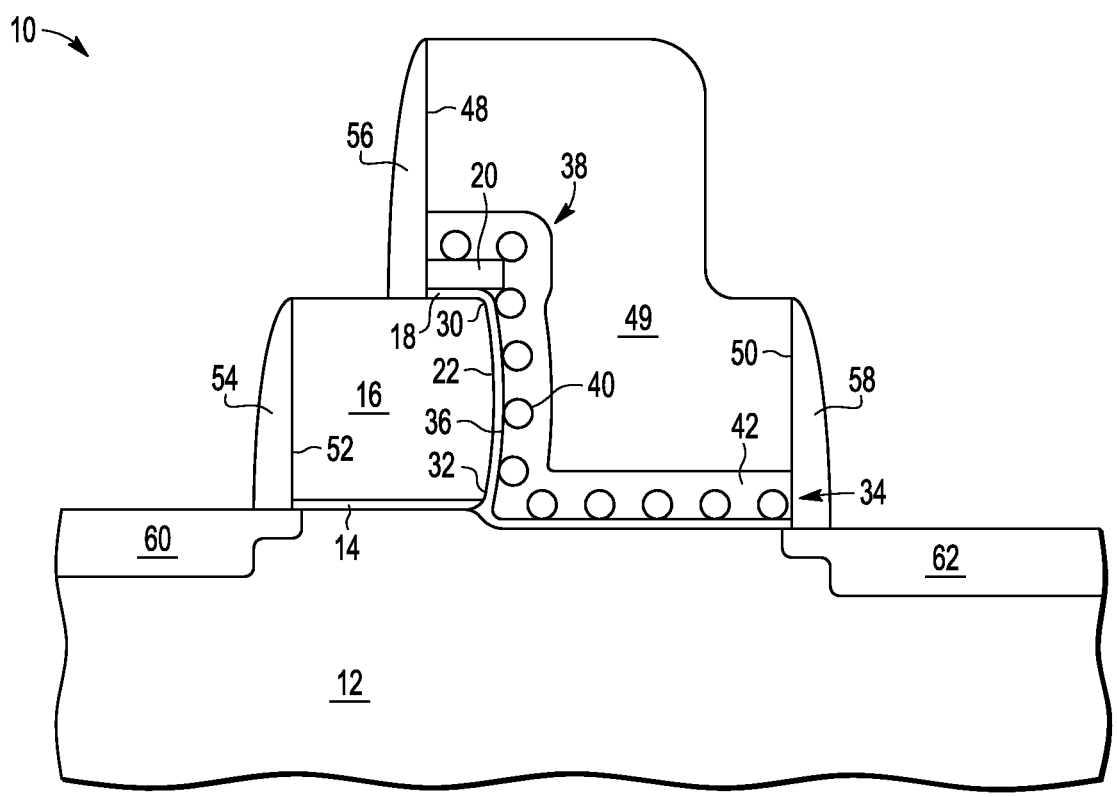
FIG. 11 is a cross section of the semiconductor device of FIG. 10 at a subsequent stage in processing.

Shown in FIG. 11 is semiconductor device 10 after forming sidewall spacers 54, 56, and 58 on sides 52, 48, and 50, respectively, and forming source/drain regions 60 and 62 in substrate using sidewall spacers 54 and 58 and gate layers 16 and 44 as masks. Shown in FIG. 11 is an NVM memory cell that has a control gate from gate layer 44 and a select gate from gate layer 16 with rounded corners 30 and 32. Subsequent siliciding of source/drains 60 and 62 and gate layers 16 and 44 may be performed to improve performance.

Rounded corners 30 and 32 reduce the electric field at those corners from corners that are not rounded. Non-rounded corners result in a stronger electric field that causes increased stress at the corners and subsequent reduction in endurance and program disturb by increasing leakage. Without rounded corners 30 and 32 but with a sharp corner, a higher field is generated at this point between gate layer 16 and gate layer 44 and substrate 12 resulting at increased leakage through charge storage layer 38 at both corners. With rounded corners 30 and 32, the field is reduced which in turn reduces the stress and in turn reduces the leakage. Thus, with reduced leakage at corners 30 and 32 endurance and program disturb are improved. The typical understanding of the problem with endurance is that occurs due to trap up. The electrons that flow from the control gate to the select gate at corner 30 are not part of the normal program and erase flows. The charge flow is designed to occur where the nanocrystals are near the channel not high on the select gate. With the normal sharp corner and the consequent high field, electrons with very tunneling can cross between the control gate and the select gate and because they are so high energy they can cause an inordinate amount of damage and actually be the controlling factor in endurance. Accordingly, rounded corner 30 significantly impacts endurance by significantly reducing the impact of the upper gate transfer of charge and especially reduces the occurrence of high energy electrons in that location. Gate leakage to substrate 12, a cause of program disturb, is also reduced.

By now it should be appreciated that there has been provided a method for forming a semiconductor device including forming a first dielectric layer over a semiconductor layer. The method further includes forming a first conductive gate layer over the first dielectric layer. The method further includes forming a second dielectric layer over the first conductive gate layer. The method further includes forming a third dielectric layer over the second dielectric layer, the third dielectric layer having a different etch characteristic than the second dielectric layer. The method further includes performing a first etch to form a first sidewall of the first conductive gate layer, wherein the first etch exposes a portion of the semiconductor layer. The method further includes performing a second etch to remove a portion of the first dielectric layer between the semiconductor layer and the first conductive gate layer, resulting in a first undercut between the semiconductor layer and the first conductive gate layer, and to remove a portion of the second dielectric layer between the third dielectric layer and the first conductive gate layer, resulting in a second undercut between the third dielectric layer and the first conductive gate layer, wherein the first undercut exposes a bottom corner of the first conductive gate layer and the second undercut exposes a top corner of the first conductive gate layer. The method further includes growing an oxide layer on the first sidewall of the first conductive gate layer, around the top corner and around the bottom corner of the first conductive gate layer, and over the exposed portion of the semiconductor layer, wherein the growing the oxide layer results in rounding each of the top corner and the bottom corner of the first conductive gate layer. The method further includes removing the oxide layer. The method further includes forming a charge storage layer over the third dielectric layer, along the first sidewall of the first conductive gate layer, and over the semiconductor layer. The method further includes forming a second conductive gate layer over the charge storage layer. The method further includes patterning the second conductive gate layer to form a first sidewall of the second conductive gate layer over the first conductive gate layer and a second sidewall of the second conductive gate layer over the semiconductor layer, wherein the second conductive gate layer overlaps the first sidewall of the first conductive gate layer and overlaps a top portion of the first conductive gate layer. The method may have a further characterization by which the step of patterning the second conductive gate layer comprises patterning the first conductive gate layer to form a second sidewall of the first conductive gate layer. The method may have a further characterization by which after the step of patterning the second conductive gate layer the method further comprises removing an exposed portion of the third dielectric layer that is exposed by the second conductive gate layer such that a remaining portion of the third dielectric layer remains between second conductive gate layer and the top portion of the first conductive gate layer that is overlapped by the second conductive gate layer. The method may have a further characterization by which the step of forming the third dielectric layer over the second dielectric layer is further characterized in that the third dielectric layer is an anti-reflective coating (ARC) layer. The method may have a further characterization by which the step of forming the second dielectric over the first conductive gate layer comprises growing the second dielectric layer in an ozone environment. The method may have a further characterization by which the step of performing the first etch to form the first sidewall of the first conductive gate layer also forms a second sidewall of the first conductive gate layer. The method may have a further characterization by which the step of forming the charge storage layer comprises, forming a bottom oxide layer, forming a plurality of nanocrystals over the bottom oxide layer, and forming a top oxide layer over and surrounding the plurality of nanocrystals. The method may have a further characterization by which the first conductive gate layer is further characterized as a select gate layer and the second conductive gate layer is further characterized as a control gate layer. The method may further comprise forming sidewall spacers adjacent a second sidewall of the first conductive gate layer, the first sidewall of the second conductive gate layer, and the second sidewall of the second conductive gate layer, forming a first source/drain region in the semiconductor layer laterally adjacent the second sidewall of the first conductive gate layer, and forming a second source/drain region in the semiconductor layer laterally adjacent the second sidewall of the second conductive gate layer. The method may have a further characterization by which each of the first and second conductive gate layers comprise polysilicon.

Also disclosed is a method for forming a semiconductor device including forming a gate dielectric layer over a semiconductor layer. The method further includes forming a select gate layer over the gate dielectric layer, wherein the select gate layer comprises polysilicon. The method further includes forming a first dielectric layer over the select gate layer. The method further includes forming an anti-reflective coating (ARC) layer over the first dielectric layer. The method further includes performing a first etch to form a select gate portion from the select gate layer having a first sidewall, wherein the first etch exposes a portion of the semiconductor layer. The method further includes performing a second etch to remove a portion of the gate dielectric layer between the semiconductor layer and the select gate layer, such that the gate dielectric layer under the select gate layer is recessed from the first sidewall of the select gate portion to expose a bottom corner of the select gate layer, and to remove a portion of the first dielectric layer between the ARC layer and the select gate portion, such that the first dielectric layer over the select gate portion is recessed from the first sidewall of the select gate portion to expose a top corner of the select gate portion. The method further includes growing an oxide layer on the first sidewall of the select gate portion, around the top corner and around the bottom corner of the first conductive gate layer, and over the exposed portion of the semiconductor layer, wherein the growing the oxide layer results in rounding each of the top corner and the bottom corner of the select gate portion. The method further includes removing the oxide layer. The method further includes forming a charge storage layer over the select gate portion, along the first sidewall of the select gate portion, and over the semiconductor layer. The method further includes forming a control gate layer over the charge storage layer, wherein the control gate layer comprises polysilicon. The method further includes patterning the control gate layer to form a first sidewall of the control gate layer over the select gate portion and a second sidewall of the control gate layer over the semiconductor layer, wherein the control gate layer overlaps the first sidewall of the select gate portion and overlaps a top portion of the select gate portion. The method may have a further characterization by which after the step of patterning the control layer, the method further includes removing an exposed portion of the ARC layer that is exposed by the control gate layer such that a remaining portion of the ARC layer remains between the control gate layer and the top portion of the select gate layer that is overlapped by the control gate layer. The method may have a further characterization by which the step of forming the first dielectric over the select gate layer comprises growing the first dielectric layer in an ozone environment. The method may have a further characterization by which the step of forming the charge storage layer includes forming a bottom oxide layer, forming a plurality of nanocrystals over the bottom oxide layer, and forming a top oxide layer over and surrounding the plurality of nanocrystals. The method may further include forming sidewall spacers adjacent a second sidewall of the select gate portion, the first sidewall of the control gate layer, and the second sidewall of the control gate layer, forming a first source/drain region in the semiconductor layer laterally adjacent the second sidewall of the select gate layer, and forming a second source/drain region in the semiconductor layer laterally adjacent the second sidewall of the control gate layer. The method may have a further characterization by which the step of patterning the control gate layer includes patterning the select gate layer to form a second sidewall of the select gate layer. The method may have a further characterization by which the step of performing the first etch to form the first sidewall of the select gate layer also forms a second sidewall of the select gate layer.

Disclosed also is a split gate memory cell including a semiconductor substrate. The split gate memory cell may further include a gate dielectric over the semiconductor substrate. The split gate memory cell further includes a select gate over the gate dielectric, wherein the select gate has a sidewall, and wherein a top corner of the select gate at the sidewall is rounded and a bottom corner of the select gate at the sidewall is rounded. The split gate memory cell further includes a charge storage layer over the semiconductor substrate and overlapping the sidewall of the select gate, wherein a portion of the charge storage layer overlaps a portion of the select gate. The split gate memory cell further includes a control gate over the charge storage layer, wherein the control gate overlaps the sidewall of the select gate and overlaps the portion of the select gate, wherein the control gate has a sidewall over the select gate. The split gate memory cell may further include a first dielectric over the portion of the select gate overlapped by the charge storage layer and under the charge storage layer such that the first dielectric is between the select gate and the charge storage layer and extends to a sidewall spacer located adjacent the sidewall of the control gate. The split gate memory cell may further include an anti-reflective coating (ARC) layer over the first dielectric over the portion of the select gate overlapped by the charge storage layer and under the charge storage layer such that the ARC layer is between the first dielectric and the charge storage layer and extends to the sidewall spacer located adjacent the sidewall of the control gate.

Although the invention is described herein with reference to specific embodiments, various modifications and changes can be made without departing from the scope of the present invention as set forth in the claims below. For example, the operation was described with regard to, silicon, oxide, and nitride but potentially other materials could be used. For example a material that is effective as a gate dielectric could be considered, especially if it could be grown on a gate material. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device comprising:
    forming a first dielectric layer over a semiconductor layer;
    forming a first conductive gate layer over the first dielectric layer;
    forming a second dielectric layer over the first conductive gate layer;
    forming a third dielectric layer over the second dielectric layer, the third dielectric layer having a different etch characteristic than the second dielectric layer;
    performing a first etch to form a first sidewall of the first conductive gate layer, wherein the first etch exposes a portion of the semiconductor layer;
    performing a second etch to remove a portion of the first dielectric layer between the semiconductor layer and the first conductive gate layer, resulting in a first undercut between the semiconductor layer and the first conductive gate layer, and to remove a portion of the second dielectric layer between the third dielectric layer and the first conductive gate layer, resulting in a second undercut between the third dielectric layer and the first conductive gate layer, wherein the first undercut exposes a bottom corner of the first conductive gate layer and the second undercut exposes a top corner of the first conductive gate layer;
    growing an oxide layer on the first sidewall of the first conductive gate layer, around the top corner and around the bottom corner of the first conductive gate layer, and over the exposed portion of the semiconductor layer, wherein the growing the oxide layer results in rounding each of the top corner and the bottom corner of the first conductive gate layer;
    removing the oxide layer;
    forming a charge storage layer over the third dielectric layer, along the first sidewall of the first conductive gate layer, and over the semiconductor layer;
    forming a second conductive gate layer over the charge storage layer; and
    patterning the second conductive gate layer to form a first sidewall of the second conductive gate layer over the first conductive gate layer and a second sidewall of the second conductive gate layer over the semiconductor layer, wherein the second conductive gate layer overlaps the first sidewall of the first conductive gate layer and overlaps a top portion of the first conductive gate layer.

2. The method of claim 1, wherein the step of patterning the second conductive gate layer comprises:
    patterning the first conductive gate layer to form a second sidewall of the first conductive gate layer.

3. The method of claim 1, wherein after the step of patterning the second conductive gate layer, the method further comprises:
    removing an exposed portion of the third dielectric layer that is exposed by the second conductive gate layer such that a remaining portion of the third dielectric layer remains between second conductive gate layer and the top portion of the first conductive gate layer that is overlapped by the second conductive gate layer.

4. The method of claim 1, wherein the step of forming the third dielectric layer over the second dielectric layer is further characterized in that the third dielectric layer is an anti-reflective coating (ARC) layer.

5. The method of claim 1, wherein the step of forming the second dielectric over the first conductive gate layer comprises growing the second dielectric layer in an ozone environment.

6. The method of claim 1, wherein the step of performing the first etch to form the first sidewall of the first conductive gate layer also forms a second sidewall of the first conductive gate layer.

7. The method of claim 1, wherein the step of forming the charge storage layer comprises:
    forming a bottom oxide layer;
    forming a plurality of nanocrystals over the bottom oxide layer; and
    forming a top oxide layer over and surrounding the plurality of nanocrystals.

8. The method of claim 1, wherein the first conductive gate layer is further characterized as a select gate layer and the second conductive gate layer is further characterized as a control gate layer.

9. The method of claim 8, further comprising:
    forming sidewall spacers adjacent a second sidewall of the first conductive gate layer, the first sidewall of the second conductive gate layer, and the second sidewall of the second conductive gate layer;
    forming a first source/drain region in the semiconductor layer laterally adjacent the second sidewall of the first conductive gate layer; and
    forming a second source/drain region in the semiconductor layer laterally adjacent the second sidewall of the second conductive gate layer.

10. The method of claim 1, wherein each of the first and second conductive gate layers comprise polysilicon.

11. A method for forming a semiconductor device comprising:
    forming a gate dielectric layer over a semiconductor layer;
    forming a select gate layer over the gate dielectric layer, wherein the select gate layer comprises polysilicon;
    forming a first dielectric layer over the select gate layer;
    forming an anti-reflective coating (ARC) layer over the first dielectric layer;
    performing a first etch to form a select gate portion from the select gate layer having a first sidewall, wherein the first etch exposes a portion of the semiconductor layer;
    performing a second etch to remove a portion of the gate dielectric layer between the semiconductor layer and the select gate layer, such that the gate dielectric layer under the select gate layer is recessed from the first sidewall of the select gate portion to expose a bottom corner of the select gate layer, and to remove a portion of the first dielectric layer between the ARC layer and the select gate portion, such that the first dielectric layer over the select gate portion is recessed from the first sidewall of the select gate portion to expose a top corner of the select gate portion;

growing an oxide layer on the first sidewall of the select gate portion, around the top corner and around the bottom corner of the first conductive gate layer, and over the exposed portion of the semiconductor layer, wherein the growing the oxide layer results in rounding each of the top corner and the bottom corner of the select gate portion;

removing the oxide layer;

forming a charge storage layer over the select gate portion, along the first sidewall of the select gate portion, and over the semiconductor layer;

forming a control gate layer over the charge storage layer, wherein the control gate layer comprises polysilicon; and patterning the control gate layer to form a first sidewall of the control gate layer over the select gate portion and a second sidewall of the control gate layer over the semiconductor layer, wherein the control gate layer overlaps the first sidewall of the select gate portion and overlaps a top portion of the select gate portion.

12. The method of claim 11, wherein after the step of patterning the control layer, the method further comprises:
removing an exposed portion of the ARC layer that is exposed by the control gate layer such that a remaining portion of the ARC layer remains between the control gate layer and the top portion of the select gate layer that is overlapped by the control gate layer.

13. The method of claim 11, wherein the step of forming the first dielectric over the select gate layer comprises growing the first dielectric layer in an ozone environment.

14. The method of claim 11, wherein the step of forming the charge storage layer comprises:
forming a bottom oxide layer;
forming a plurality of nanocrystals over the bottom oxide layer; and
forming a top oxide layer over and surrounding the plurality of nanocrystals.

15. The method of claim 11, further comprising:
forming sidewall spacers adjacent a second sidewall of the select gate portion, the first sidewall of the control gate layer, and the second sidewall of the control gate layer;
forming a first source/drain region in the semiconductor layer laterally adjacent the second sidewall of the select gate layer; and
forming a second source/drain region in the semiconductor layer laterally adjacent the second sidewall of the control gate layer.

16. The method of claim 11, wherein the step of patterning the control gate layer comprises:
patterning the select gate layer to form a second sidewall of the select gate layer.

17. The method of claim 11, wherein the step of performing the first etch to form the first sidewall of the select gate layer also forms a second sidewall of the select gate layer.

18. A split gate memory cell comprising:
a semiconductor substrate;
a gate dielectric over the semiconductor substrate;
a select gate over the gate dielectric, wherein the select gate has a sidewall, and wherein a top corner of the select gate at the sidewall is rounded and a bottom corner of the select gate at the sidewall is rounded;
a charge storage layer comprising a plurality of nanocrystals over the semiconductor substrate and overlapping the sidewall of the select gate including along the rounded to corner and the rounded bottom corner, wherein a portion of the charge storage layer overlaps a portion of the select gate; and
a control gate over the charge storage layer, wherein the control gate overlaps the sidewall of the select gate and overlaps the portion of the select gate, wherein the control gate has a sidewall over the select gate and the charge storage layer is between the select gate and the control gate where sidewall of the control gate overlaps the portion of the select gate and where the sidewall of the control gate is over the select gate.

19. The split gate memory cell of claim 18, further comprising:
a first dielectric over the portion of the select gate overlapped by the charge storage layer and under the charge storage layer such that the first dielectric is between the select gate and the charge storage layer and extends to a sidewall spacer located adjacent the sidewall of the control gate.

20. The split gate memory cell of claim 19, further comprising:
an anti-reflective coating (ARC) layer over the first dielectric over the portion of the select gate overlapped by the charge storage layer and under the charge storage layer such that the ARC layer is between the first dielectric and the charge storage layer and extends to the sidewall spacer located adjacent the sidewall of the control gate.

* * * * *